United States Patent
Xue et al.

(10) Patent No.: US 9,520,510 B2
(45) Date of Patent: Dec. 13, 2016

(54) EMBEDDED OPTICAL SENSORS USING TRANSVERSE FABRY-PEROT RESONATOR AS DETECTORS

(71) Applicant: SAMSUNG DISPLAY CO., LTD., Yongin, Gyeonggi-Do (KR)

(72) Inventors: Jiuzhi Xue, Broomfield, CO (US); Krishna C. Balram, Germantown, MD (US); David M. Hoffman, Fremont, CA (US)

(73) Assignee: Samsung Display Co., Ltd., Yongin (KR)

(*) Notice: Subject to any disclaimer, the term of this patent is extended or adjusted under 35 U.S.C. 154(b) by 0 days.

(21) Appl. No.: 14/550,821

(22) Filed: Nov. 21, 2014

(65) Prior Publication Data
US 2015/0155400 A1 Jun. 4, 2015

Related U.S. Application Data

(60) Provisional application No. 61/911,426, filed on Dec. 3, 2013.

(51) Int. Cl.
*H01L 29/04* (2006.01)
*H01L 31/0232* (2014.01)
(Continued)

(52) U.S. Cl.
CPC ....... *H01L 31/02327* (2013.01); *G06F 3/0412* (2013.01); *G06F 3/0421* (2013.01);
(Continued)

(58) Field of Classification Search
CPC .... G06F 3/0304; G06F 3/0412; G06F 3/0421; H01L 27/1446; H01L 27/14609; H01L 31/022408; H01L 31/02327; H01L 31/1085
(Continued)

(56) References Cited

U.S. PATENT DOCUMENTS 5,289,015 A * 2/1994 Chirovsky ............. G02F 3/028
257/21
5,461,246 A * 10/1995 Chou .................. H01L 31/1085
257/449
(Continued)

FOREIGN PATENT DOCUMENTS

EP    0 164 541 A2    12/1985
JP    2011-007838    1/2011
(Continued)

OTHER PUBLICATIONS

Balram, et al.; Self-aligned silicon fins in metallic slits as a platform for planar wavelength-selective nanoscale resonant photodetectors; Optics Express 22735, Sep. 24, 2012, Vo. 20, No. 20.
(Continued)

*Primary Examiner* — Mohammed Shamsuzzaman
(74) *Attorney, Agent, or Firm* — Lewis Roca Rothgerber Christie LLP

(57) ABSTRACT

A detector to detect light of a wavelength range and an incidence angle range, the detector including a substrate, a plurality of dielectric structures on the substrate, each one of the plurality of dielectric structures being to receive light through a side of the dielectric structure opposite the substrate, and a plurality of conductive structures on the substrate, consecutive conductive structures of the plurality of conductive structures having a corresponding dielectric structure of the plurality of dielectric structures therebetween, wherein the consecutive conductive structures and the corresponding dielectric structure form a cavity to induce an absorption resonance in response to receiving the light of the wavelength range.

19 Claims, 13 Drawing Sheets

(51) Int. Cl.
*H01L 27/144* (2006.01)
*G06F 3/041* (2006.01)
*G06F 3/042* (2006.01)
*H01L 31/0224* (2006.01)
*H01L 27/146* (2006.01)
*H01L 31/108* (2006.01)
*H01L 29/78* (2006.01)

(52) U.S. Cl.
CPC .... *H01L 27/1446* (2013.01); *H01L 27/14609* (2013.01); *H01L 31/022408* (2013.01); *H01L 31/1085* (2013.01); *H01L 29/7839* (2013.01)

(58) Field of Classification Search
USPC ..... 257/443, 214.1, 457, 449, 21, 53; 385/4, 385/27
See application file for complete search history.

(56) References Cited

U.S. PATENT DOCUMENTS

| | | | | |
|---|---|---|---|---|
| 5,631,490 | A * | 5/1997 | Dutta | H01L 31/1085 257/439 |
| 7,423,254 | B2 * | 9/2008 | Arend | H01L 31/1085 250/214 R |
| 8,829,633 | B2 | 9/2014 | Balram et al. | |
| 2002/0081766 | A1 | 6/2002 | Iriguchi | |
| 2003/0010979 | A1 | 1/2003 | Pardo et al. | |
| 2009/0033923 | A1 | 2/2009 | Lyu et al. | |
| 2011/0255046 | A1 | 10/2011 | Kurokawa et al. | |
| 2013/0292788 | A1 * | 11/2013 | Coimbatore Balram | H01L 31/0352 257/443 |

FOREIGN PATENT DOCUMENTS

| | | |
|---|---|---|
| KR | 10-2006-0071019 A | 6/2006 |
| KR | 101084366 B1 | 11/2011 |
| WO | WO 2006/094081 A2 | 9/2006 |
| WO | WO 2006/094081 A3 | 9/2006 |

OTHER PUBLICATIONS

EPO Search Report dated Nov. 27, 2015, for corresponding European Patent application 14195576.5, (21 pages).

EPO Search Report dated Jul. 6, 2015, for corresponding European Patent application 14195576.5, (8 pages).

Balram, K.C., et al: *Nanoscale resonant-cavity-enhanced germanium photodetectors with lithographically defined spectral response for improved performance at telecommunications wavelengths*, Optics Express, vol. 21, No. 8, Apr. 18, 2013, pp. 10228-10233, XP055197501.

Chen, R., et al, *MSM-Based Integrated CMOS Wavelength-Tunable Optical Receiver*, IEEE Photonics Technology Letters, vol. 17, No. 6, Jun. 1, 2005, pp. 1271-1273, XP011132292.

* cited by examiner

EMBEDDED OPTICAL SENSORS USING TRANSVERSE FABRY-PEROT RESONATOR AS DETECTORS

CROSS-REFERENCE TO RELATED APPLICATION(S)

This patent application claims priority to and the benefit of U.S. Provisional Application Ser. No. 61/911,426, filed Dec. 3, 2013, titled "Embedded Optical Sensors Using Transverse Fabry-Perot Resonator as Detectors," the entire content of which is incorporated herein by reference.

BACKGROUND

1. Field

Embodiments of the present invention relate to an optical sensor embeddable in a display device using transverse Fabry-Perot resonator as detectors.

2. Related Art

Display devices have become increasingly popular and are widely used, such as in cell phones, computer monitors, televisions, tablets, etc. These display devices may be any suitable type (kind) of display, including an organic light emitting display (OLED), a liquid crystal display (LCD), etc. In particular, display devices including optical sensors have been developed to, for example, detect a user's interaction with the display device (e.g., an interaction with the display device via the user's finger or via use of a stylus), sense ambient light, scan documents, scan finger print, etc.

In the realm of touch enabled display systems, the approach of the related art is to physically bond a touch panel over the display device. However, bonding a touch panel reduces display performance parameters, such as contrast ratio and light throughput, and adds thickness and weight to the display system. Further, capacitive in-cell touch solutions, which are often employed in touch panels, have significant yield and noise handling issues, resulting in increased manufacturing costs.

Solutions exist for embedding optical sensing arrays; however, these related art solutions tend to suffer from a number of shortcomings. For example, related art embedded optical sensors offer little to no sensing wavelength selection, which results in low signal to noise ratio under normal ambient lighting conditions. The optical sensors generally absorb a broad spectrum of light rather than being sensitive to only a narrow band of light. This may necessitate using optical filters, which may be very expensive and, in some applications, may not even be feasible due to structural limitations. Further, given the difficulty of integrating optical filters, existing embedded solutions offer very limited imaging capability. Related art sensors have little to no angular selectivity, which limits their use to situations in which sensing light is collimated, making them impractical in most cases. Additionally, related art embedded sensors exhibit low light detection efficiency. To increase the detection efficiency, the thickness of the light sensing material may be increased, which adversely affects the response time and may be expensive.

What is desired is an inexpensive embedded optical sensor that offers high angular and wavelength selectivity as well as detection efficiency, without the need for optical lenses or filters.

SUMMARY

Aspects of embodiments of the present invention are directed toward an optical sensor using transverse Fabry-Perot (TFP) resonator as detectors and a method of operating the same.

Aspects of embodiments of the present invention are directed toward a wavelength and direction sensitive (and selective) detector (e.g., infra-red detector) that may be integrated into a display system to enable various new forms of interactivity with the display system.

Embodiments of the present invention provide a detector including a thin-film 2-dimensional pattern of wavelength-scale transverse resonant cavities on a substrate that cause resonant absorption of light coming in directions perpendicular to or at an angle to the substrate and greatly enhance sensitivity to the incoming light of a predetermined wavelength. In some embodiments, the detectors are wavelength and orientation specific permitting lenseless imaging. Further, combinations of detectors may be used to achieve a high degree of angular selectivity that may not be achievable with related art sensors.

In some embodiments, the detector is ultra-thin allowing a plurality of detectors to be constructed inside or outside of the display structure, such as on the TFT substrate underneath display pixels, which may reduce (e.g., minimize) the impact of the detectors on display performance. The detectors may be compatible with linear and circular polarizer contrast enhancement films often employed in display systems.

According to some embodiments of the present invention, there is provided a detector to detect light of a wavelength range and an incidence angle range, the detector including: a substrate; a plurality of dielectric structures on the substrate, each one of the plurality of dielectric structures being to receive light through a side of the dielectric structure opposite the substrate; and a plurality of conductive structures on the substrate, consecutive conductive structures of the plurality of conductive structures having a corresponding dielectric structure of the plurality of dielectric structures therebetween, wherein the consecutive conductive structures and the corresponding dielectric structure form a cavity to induce an absorption resonance in response to receiving the light of the wavelength range.

In some embodiments, widths of successive ones of the plurality of dielectric structures progressively increase.

In some embodiments, widths of successive ones of the plurality of conductive structures progressively increase.

In some embodiments, the plurality of dielectric structures includes semiconductor materials.

In some embodiments, the semiconductor materials include at least one of silicon, poly-silicon, amorphous silicon.

In some embodiments, the plurality of conductive structures includes at least one of gold, silver, aluminum, copper.

In some embodiments, wherein the consecutive conductive structures are to receive a differential voltage, wherein the differential voltage induces the cavity to generate a current in response to light absorbed by the conductive and dielectric structures.

In some embodiments, the plurality of dielectric and conductive structures form a plurality of cavities including the cavity, each one of the plurality of cavities being to generate a signal in response to the received light having the wavelength range, the generated signal being indicative of the angle of incidence, both polar and azimuthal, of the received light having the wavelength range.

In some embodiments, the detector further includes a detection circuit to combine generated signals of neighboring cavities from the plurality of cavities in a predetermined phase relation, and to generate an output signal when an angle of incidence of the received light having the wavelength range is within the incidence angle range, wherein the polar angle of incidence is the angle between the propagation direction of incoming light and the normal to the detector plane, and the azimuthal angle is the angle between a pre-selected plane normal to the detector plane and the plane of incidence defined by the light propagation direction and detector normall.

In some embodiments, the cavity is substantially transparent to visible light.

According to some embodiments of the present invention, there is provided a multi-cell detection unit to detect a normally incident light of a wavelength range, the multi-cell detection unit including: a plurality of detectors, each detector being to generate a signal in response to detecting light of a wavelength range having an incidence plane normal to the detector and parallel to a lengthwise direction of a cavity of the detector, each detector including: a substrate; a plurality of dielectric structures on the substrate, each one of the plurality of dielectric structures being to receive light through a side of the dielectric structure opposite the substrate; and a plurality of conductive structures on the substrate, consecutive conductive structures of the plurality of conductive structures having a corresponding dielectric structure of the plurality of dielectric structures therebetween, wherein the consecutive conductive structures and the corresponding dielectric structure form a cavity to induce an absorption resonance in response to receiving the light of the wavelength range, wherein lengthwise directions of cavities of a first and second detectors of the plurality of detectors are at an angle to one another.

In some embodiments, a concurrent detection by the first and second detectors indicates detection of the normally incident light of the wavelength range.

In some embodiments, the first and second detectors are at a same plane, and the lengthwise directions of the cavities of the first and second detectors are orthogonal to one another.

According to some embodiments of the present invention, there is provided an optical light sensor to detect a light of a wavelength range, the optical light sensor including: a plurality of p-type semiconductors and a plurality of n-type semiconductors alternately arranged in a transverse direction; a plurality of intrinsic semiconductors, each intrinsic semiconductor between a corresponding one of the p-type semiconductors and a corresponding one of the n-type semiconductors; and a plurality of electrodes on the plurality of p-type and n-type semiconductors, and forming a plurality of cavities with corresponding ones of the plurality of intrinsic semiconductors therebetween, wherein ones of the plurality of electrodes on the plurality of p-type semiconductors are coupled together, and ones of the plurality of electrodes on the plurality of n-type semiconductors are coupled together, wherein at least one of the plurality of cavities is exposed to incident light in a longitudinal direction.

In some embodiments, the at least one of the plurality of cavities is to induce an absorption resonance in response to received light of the wavelength range.

In some embodiments, the optical light sensor further includes an insulation layer on the plurality of intrinsic semiconductors and the plurality of electrodes.

In some embodiments, the optical light sensor further includes a gate electrode on a cavity of the plurality of cavities, and to block light of the wavelength range from reaching the cavity.

In some embodiments, widths of successive ones of the plurality of intrinsic semiconductors and/or widths of successive ones of the plurality of electrodes progressively increase.

According to some embodiments of the present invention, there is provided an optical sensing array to detect a light of a wavelength range, the optical sensing array including: a plurality of row conductors; a plurality of column conductors crossing the row conductors; a plurality of optical light sensors coupled to the plurality of row and column conductors, each one of the plurality of optical light sensors including: a plurality of p-type semiconductors and a plurality of n-type semiconductors alternately arranged in a transverse direction; a plurality of intrinsic semiconductors, each intrinsic semiconductor between a corresponding one of the p-type semiconductors and a corresponding one of the n-type semiconductors; a plurality of electrodes on the plurality of p-type and n-type semiconductors, and forming a plurality of cavities with corresponding ones of the plurality of intrinsic semiconductors therebetween; and a gate electrode on a cavity of the plurality of cavities, and to block light of the wavelength range from reaching the cavity, the gate electrode being coupled to one of the plurality of column conductors, wherein ones of the plurality of electrodes on the plurality of p-type semiconductors are coupled together, and ones of the plurality of electrodes on the plurality of n-type semiconductors are coupled together, wherein at least one of the plurality of cavities is configured to be exposed to incident light in a longitudinal direction.

In some embodiments, each one of the plurality of optical light sensors is to generate a current in response to, and in proportion to, received light of the wavelength range when the row conductor is addressed via a row driver.

According to some embodiments of the present invention, there is provided a display device including said optical sensing array.

BRIEF DESCRIPTION OF THE DRAWINGS

The above and other aspects of embodiments of the present invention will become more apparent by describing in detail exemplary embodiments thereof with reference to the accompanying drawings, in which.

DETAILED DESCRIPTION

Figure 1A:
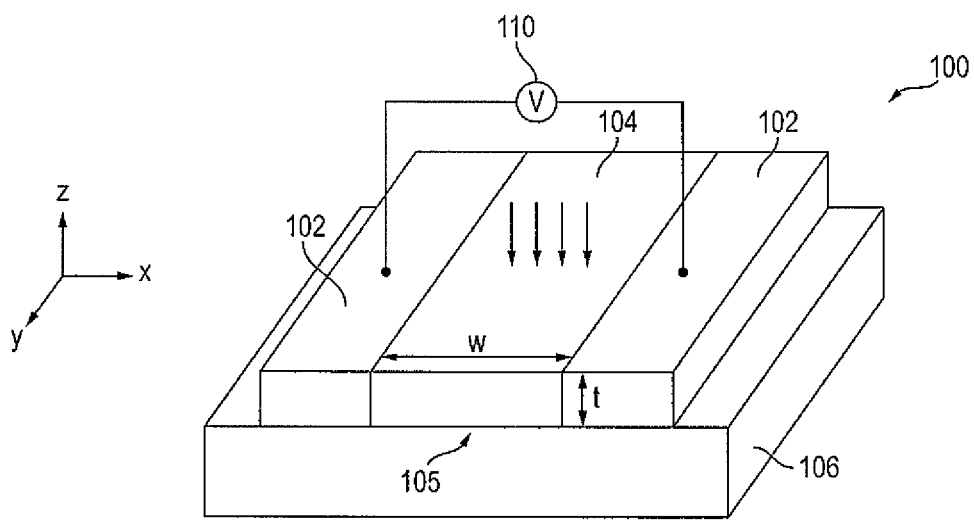
FIG. 1A is a perspective view of a transverse Fabry-Perot (TFP) resonator, according to some example embodiments of the present invention.

Hereinafter, embodiments of the present invention will be described more fully with reference to the accompanying drawings, in which, exemplary embodiments of the present invention are shown. As those skilled in the art would realize, the described embodiments are susceptible to various modifications and alternative forms without departing from the spirit or scope of the present invention. For clarity of the description of the present invention, some elements or features not required for the complete understanding of the present invention may be omitted.

The terms used in the present specification are used to describe particular embodiments, and are not intended to limit the present invention. For example, it will be understood that, although the terms "first," "second," etc. may be used herein to describe various elements, these elements would not be limited by the strict construction of these terms. Instead, these terms are used only to distinguish one component from another. Further, an expression used in the singular encompasses the expression of the plural, unless it has a clearly different meaning in the context. In the present specification, it is to be understood that the terms such as "comprising," "including," "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that when an element or layer is referred to as being "on," "connected to," or "coupled to" another element or layer, it can be directly on, connected to, or coupled to the other element or layer, or one or more intervening elements or layers may also be present. Similarly, when an element or layer is referred to as being "connected at" or "coupled at" another element or layer, the element or layer may be directly or indirectly "connected at" or "coupled at" said another element or layer. When an element is referred to as being "directly on," "directly connected to," "directly coupled to," "directly connected at," or "directly coupled at" another element or layer, there are no intervening elements or layers present. Like numbers refer to like elements throughout. As used herein, the term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" or "over" the other elements or features. Thus, the exemplary term "below" may encompass both an orientation of above and below. The device may be otherwise oriented (e.g., rotated 90 degrees or at other orientations) and the spatially relative descriptors used herein should be interpreted accordingly. When the phrase "at least one of" is applied to a list, it is being applied to the entire list, and not to the individual members of the list.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Further, when describing embodiments of the present invention, the use of "may" relates to "one or more embodiments of the present invention."

As used herein, the term "substantially," "about," and similar terms are used as terms of approximation and not as terms of degree, and are intended to account for the inherent deviations in measured or calculated values that would be recognized by those of ordinary skill in the art. Also, the terms "use," "using," and "used" may be considered synonymous with the terms "utilize," "utilizing," and "utilized," respectively.

Like reference numerals in the drawings denote like elements, and repeated descriptions thereof may be omitted.

According to some embodiments of the present invention, a detector (e.g., a transverse Fabry-Perot detector) includes a TFP resonator exhibiting resonant absorption of light at designed wavelengths, while transmitting or reflecting other wavelengths of light. Thus, the TFP resonator (and hence the detector) shows a high level of sensitivity to the designed wavelengths, which may constitute a narrow wavelength band.

In some embodiments, the detector includes an array of TFP resonators arranged according to a spacing (e.g., predetermined spacing). The spacing between the resonators and the relative phase between the neighboring resonators (e.g., whether the photoelectric signals from the neighboring resonators are detected in phase or out of phase (differentials)) may be designed such that the detector only absorbs substantially normally incident light. Due to the phenomenon of light interference, suitable spacing configuration and relative phase relations may result in the detector exhibiting a strong angular dependence of light absorption. For example, a particular spacing between the resonators may allow for the detector to be sensitive to an obliquely incident light only.

According to some embodiments, the direction-sensitive array of TFP resonators is integrated with (e.g., embedded in) a display system (e.g., a display matrix) enabling high signal to noise ratio detection of (multi-)touch, hover gesture, imaging, and other functions with no focusing optics. For example, embodiments of the present invention may be employed in an ultrathin fingerprint scanning device that may be installed in a mobile device, such as a smart phone.

Figure 1B:
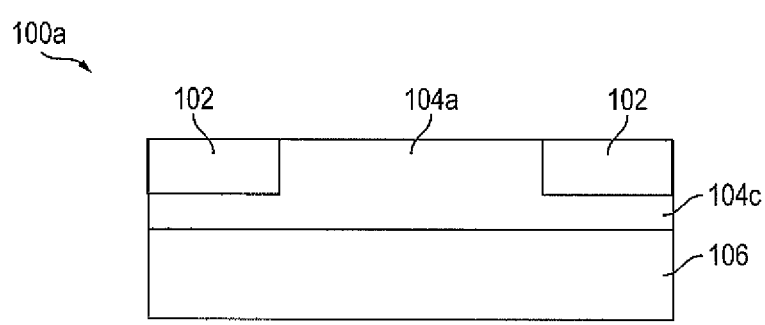
FIG. 1B is a cross-sectional view of a TFP resonator, according to some example embodiments of the present invention.

FIG. 1A is a perspective view of a transverse Fabry-Perot resonator 100, according to some example embodiments of the present invention. FIG. 1B is a cross-sectional view of a transverse Fabry-Perot resonator 100a, according to some example embodiments of the present invention.

According to some embodiments, the TFP resonator (e.g., nano TFP resonator) 100 includes two conductive structures (e.g., two electrodes or metal layers) 102, a dielectric structure (e.g., a semiconductor structure) 104 sandwiched therebetween, and a substrate 106 on which the conductive and dielectric structures 102 and 104 are positioned (e.g., formed). The conductive structures 102 may be the same metal or may be different metals that, in some embodiments, have minimal absorption in the wavelength of interest. The conductive structures 102 may include a metal, such as gold, silver, copper, or aluminum. The dielectric structure 104 may include a semiconductor, such as silicon and germanium, and their various crystal forms, e.g., crystal silicon, poly-silicon, amorphous silicon, and/or the like. The substrate 106 may include any suitable insulating material so long as the index of the refraction of the insulating material is lower than that of the dielectric layer. In some examples, the substrate 106 may include silicon dioxide ($SiO_2$) and its special crystal form quartz and silicon nitride (SiN). The large dielectric contrast between the conductor and dielectric structures 102 and 104 produces a cavity (e.g., a slit cavity) 105 capable of exciting one or more in-plane absorption resonances (e.g., resonances in the X-Y plane, as shown in FIG. 1) under surface-normal light incidence. Thus, the conductor-semiconductor-conductor geometry forms a Fabry-Perot resonator transverse to the light propagation direction (e.g., Z direction, as shown in FIG. 1). An absorption ratio of near or about unity (1) may be achieved at resonant wavelengths.

The resonant absorption of the TFP resonator 100 may be tuned by varying the width W of the dielectric structure 104 (or cavity 105). For example, as the width W is increased, the wavelength of the resonant absorption may also increase. In some embodiments, the width W may be from about 50 nm to about 900 nm. Further, the TFP resonator 100 may be fabricated to be ultra-thin, as the thickness t need only be large enough to support resonance at a given width W of the resonator 100. For example, the thickness t may be about 120 nm, and may be in the range of about 50 nm to about 250 nm. While the above provides examples of values and ranges for the size of the TFP resonator, embodiments of the present invention are not limited thereto and any other suitable size may be adopted for a desired resonance wavelengths.

The absorbed photons (e.g., the photons at the resonant wavelengths) may be converted to charge carrier pairs that change the electrical properties of the transverse Fabry Perot structure such as lower resistance or a flow of charge carriers (current), which may then be sensed by various suitable methods to make the transverse Fabry Perot a photosensitive device. In some embodiments, a voltage V is applied via the voltage source 110, and the TFP resonator 100 may have a lower resistance due to increased charge carrier generated by the absorbed photons.

Referring to FIG. 1B, in some embodiments of the present invention, the dielectric structure 104a of the TFP resonator 100a may have a fin-structure with wings 104c extending under the conductive structures 102. The wings may be very thin, for example a few nanometers such as about 5 nm thick, and they significantly enhance the electric contact between conductive electrodes and the dielectric light absorbing structure (e.g., dielectric light absorbing fin) 104a. The TFP resonator 100a is otherwise similar to the TFP resonator 100 in function and structure.

While some of the examples and embodiments described herein may refer to the TFP resonator 100, the concepts described are not dependent on the structure of the dielectric structure and may be equally applicable to, for example, the TFP resonator 100a. Thus, in the following every reference to the TFP resonator 100 and/or the dielectric structure 104 will be understood as also a reference to the TFP resonator 100a and/or the dielectric structure 104a.

Figure 2A:
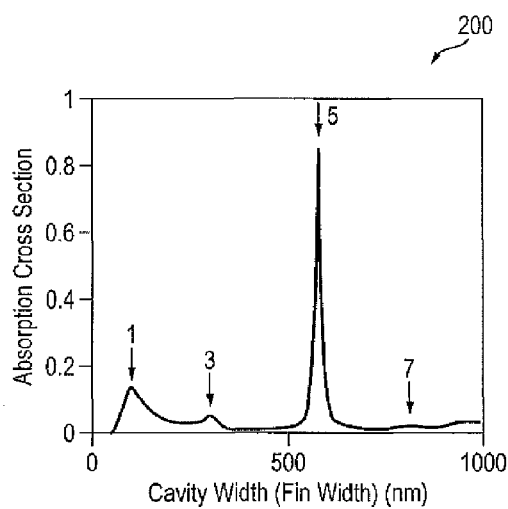
FIG. 2A is a graph illustrating the light absorption of the TFP resonator as a function of width of the dielectric layer for a specific wavelength of incident light, according to some example embodiments of the present invention.

FIG. 2A is a graph illustrating the light absorption of the TFP resonator as a function of width of the dielectric layer for a specific wavelength of incident light, according to some example embodiments of the present invention. In some embodiments, the dielectric material in the dielectric structure 104 is poly-silicon with dielectric constant $n^2$, and the incident light has a wavelength $\lambda$. The device shows resonant absorption at $\lambda/2n$, $3\lambda/2n$, $5\lambda/2n$, $7\lambda/2n$ ... and shows strongest resonant absorption at $5\lambda/2n$, as shown in FIG. 2A, where n is the index of refraction of the dielectric material.

Figure 2B:
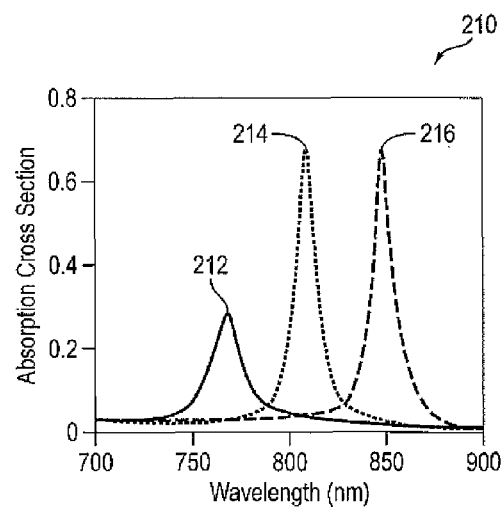
FIG. 2B is a graph illustrating the simulated absorption spectra of the TFP resonator as a function of wavelength for different device widths, according to some example embodiments of the present invention.
Figure 2C:
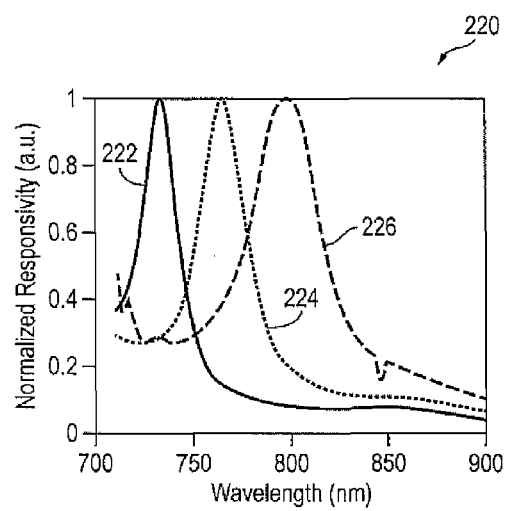
FIG. 2C is a graph illustrating the measured absorption spectra of the TFP resonator 100 as a function of wavelength, for different device widths, according to some example embodiments of the present invention.

FIG. 2B is a graph 210 illustrating the simulated absorption spectra of the TFP resonator 100 as a function of wavelength for different widths (e.g., fin widths) of the dielectric structure 104, according to some example embodiments of the present invention. FIG. 2C is a graph 220 illustrating the measured and normalized absorption spectra of the TFP resonator 100 as a function of wavelength, for different widths (e.g., fin widths) of the device 100, according to some example embodiments of the present invention.

Referring to FIG. 2B, the curves 212, 214, and 216 represent the simulated absorption cross-sections (as a fraction of cross-section) of TFP resonators 100 having widths W equal to about 500, 550, and 600 nm, respectively. Referring to FIG. 2C, the curves 222, 224, and 226 represent the measured absorption spectra (as a fraction of cross-section) of TFP resonators 100 having widths W equal to about 500, 550, and 600 nm, respectively. The absorption cross sections of curves 222, 224, and 226 have been scaled so that the maximum response is 1. As shown in FIGS. 2B and 2C, the resonant wavelength of the TFP resonator 100 increases as the width of the dielectric structure 104 of the resonator 100 increases.

The TFP resonator 100 may be polarization and angular sensitive. For example, the cavity of the resonator 100 may be able to detect light only from a narrow range of incident angles in the plane of the cavity. However, an array of TFP resonators may be arranged in a suitable manner to form a detector exhibiting modified characteristics, such as angular selectivity that is narrower than and/or outside of the range of detection of a single TFP resonator 100.

Figure 3A:
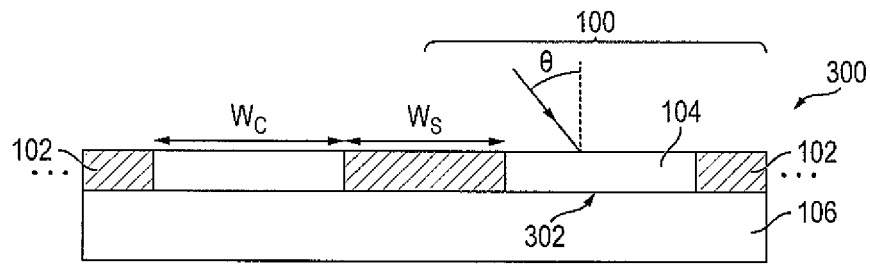
FIG. 3A is a cross-sectional view of a portion of a detector including evenly spaced TFP resonators, according to some example embodiments of the present invention.
Figure 3B:
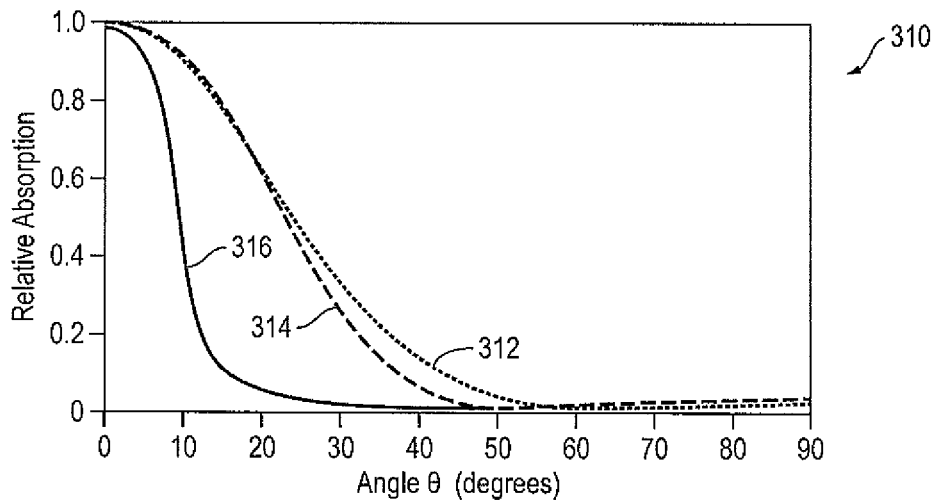
FIG. 3B is a graph comparing the simulated and normalized angular sensitivity of a standalone TFP resonator and a detector having a plurality of evenly spaced TFP resonators, according to some example embodiments of the present invention.
Figure 3C:
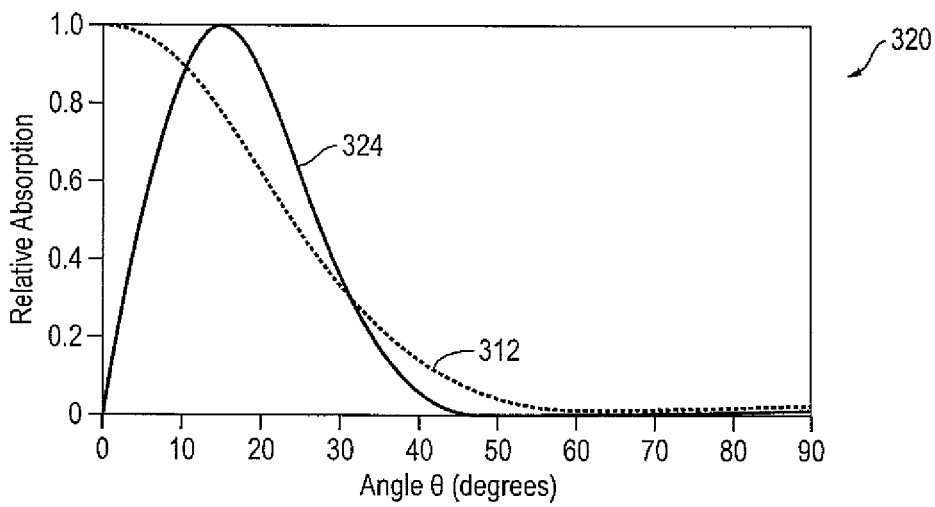
FIG. 3C is a graph comparing the simulated angular response of a single TFP resonator and a differential response of a detector including two adjacent TFP resonators, according to some example embodiments of the present invention.

FIG. 3A is a cross-sectional view of a portion of a detector 300 including evenly spaced TFP resonators 100, according to some example embodiments of the present invention. FIG. 3B is a graph 310 comparing the simulated angular sensitivity of a standalone TFP resonator 100 and a TFP resonator in a detector 300 having a plurality of evenly spaced TFP resonators 100, according to some example embodiments of the present invention. FIG. 3C is a graph 320 comparing the simulated angular response of a single TFP resonator 100 and a differential response of a detector 300 including two evenly spaced TFP resonators 100, according to some example embodiments of the present invention. The differential response of the detector 300 (as represented by curve 324) in FIG. 3C has a peak angular sensitivity that is shifted from that of a single TFP resonator 100.

Referring to FIG. 3A, a detector may include a plurality of TFP resonators 100 that are evenly spaced (e.g., the cavities 302 of adjacent TFP resonators 100 may be equally separated).

As shown in FIG. 3B, while a single TFP resonator 100 may have a narrow angular sensitivity, as illustrated by curve 312, the presence of a neighboring TFP resonator 100 may sharpen (e.g., further narrow) the angular selectivity of each of the TFP resonators 100, as represented by curve 314, which is the normalized absorption spectrum of two TFP resonators 100 and is detected in phase. In a detector including a large array of TFP resonators 100 (as may be readily feasible at nanoscale), the angular selectivity of each TFP resonator 100 may be further sharpened (e.g., narrowed), as represented by curve 316. The angular sensitivity of the TFP resonators 100 exhibits a peak at an angle θ of zero degrees. (The angles θ forming the horizontal axes of the graphs 310 and 320 of FIGS. 3B-3C are measured with respect to a line normal to (e.g., perpendicular to) an upper surface of the detector 300, as shown in FIG. 3A). In the example of FIG. 3B, the cavity width $W_C$ of each of the TFP resonators 100 may be about 575 nm, and the separation $W_S$ between neighboring (e.g., adjacent) cavities 302 may be about 370 nm. The resonance wavelength for the TFP resonator 100 shows a dependence on the cavity length. However, for a cavity length of about 1.5 μm or greater (e.g., a length that is several times the cavity width). The resonance wavelength may approach asymptote and, for the embodiment of FIG. 3A, the resonant absorption wavelength is about 824 nm.

According to some example embodiments, the detector 300 may achieve angular selectivity by combining (e.g., subtracting) the corresponding output signals (e.g., resonance responses) of adjacent TFP resonators 100. As shown by FIG. 3C, the difference between the responses of adjacent TFP resonators 100 (as represented by curve 324) may have a peak at a displaced (e.g., non-zero) angle of incidence (this angular shift is also referred to as phase scattering). In the example of FIG. 3C, the cavity width $W_C$ of each of the TFP resonators 100 may be about 575 nm and the separation $W_S$ between neighboring (e.g., adjacent) cavities 302 may be about 100 nm. This may leads to an angular sensitivity shift of about 15 degrees.

According to some embodiments, the peak difference in absorption response (and thus, the angular selectivity) of the detector 300 may be tuned to any desired angle by adjusting the cavity width (e.g., fin width) $W_C$ and the separation $W_S$. In some example embodiments, the cavity width $W_C$ determines the resonance wavelength of the TFP resonator 100 (or that of the detector 300), but may not affect the angular sensitivity (e.g., directional angular selectivity) of the detector 300. In some embodiments, the angle sensitivity (e.g., the angle as which the difference response peaks) is determined by the separation $W_S$.

Figure 4:
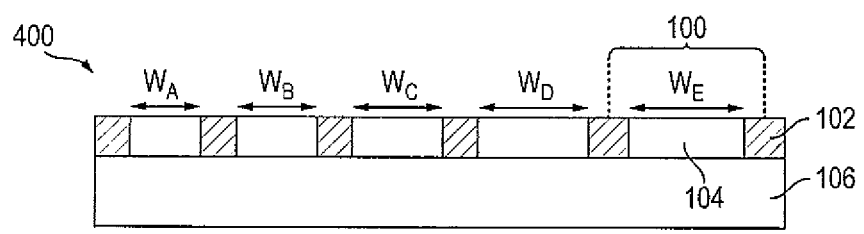
FIG. 4 illustrates a portion of a detector including chirped TFP resonators, according to some example embodiments of the present invention.

FIG. 4 illustrates a portion of a detector 400 including chirped TFP resonators 100, according to some example embodiments of the present invention.

In some embodiments, the cavity width of consecutive TFP resonators 100 (e.g., $W_A$, $W_B$, $W_C$, $W_D$, and $W_E$) may be increased (e.g., progressively increased such that $W_A < W_B < W_C < W_D < W_E$) to produce a detector (e.g., a chirped detector) 400 with a tuned direction selectivity. As a result of the chirp in cavity widths, the net absorption may be maximized when the incident light has a specific angular direction that creates appropriate (e.g., slightly different) phase delay. In some example embodiments, the chirp may be linear, in which case the following relationship may exist between the consecutive TFP resonators 100 forming part of the detector 400:

| Cavity Width | Resonant Wavelength | Phase of Incident Light |
|---|---|---|
| $W_A = W_C - 2\Delta$ | $\lambda_A = \lambda_C - 2\gamma$ | $\phi_A = \phi_C - 2\delta$ |
| $W_B = W_C - \Delta$ | $\lambda_B = \lambda_C - \gamma$ | $\phi_B = \phi_C - \delta$ |
| $W_C$ | $\lambda_C$ | $\phi_C$ |
| $W_D = W_C + \Delta$ | $\lambda_D = \lambda_C + \gamma$ | $\phi_D = \phi_C + \delta$ |
| $W_E = W_C + 2\Delta$ | $\lambda_E = \lambda_C + 2\gamma$ | $\phi_E = \phi_C + 2\delta$ | where $\Delta$, $\gamma$, and $\delta$ represent incremental increases in cavity width, resonant frequency, and incident light phase delay, respectively, of a TFP resonator 100 of the chirped detector 400. According to some embodiments, the chirp may be selected such that the difference of the resonant center wavelengths of the narrowest and the widest TFP resonators 100 is within a few times the full width at half maximum of an absorption spectrum of the resonator 100, for example, twice the full width at half maximum.

The responses (e.g., response signals) from adjacent TFP resonators 100 may be combined to achieve directional selectivity by the chirped detector 400. The combination method may depend on the number and dimensions of the TFP resonators 100 in the chirped detector 400. In some example embodiments, in order to achieve a particular directional selectivity, the response signals from the adjacent TFP resonators 100 are phase delayed from one another by one or more predetermined amounts and then summed together (or averaged). The phase delays may be introduced through hardware (e.g., phase delay elements) and/or be performed in software after the response signals are digitized an inputted to a processor-based device.

While the chirped detector 400 illustrated in FIG. 4 has a chirped cavity width, embodiments of the present invention are not limited thereto, and, in some embodiments of the present invention, either or both of the cavity widths and cavity separations may be chirped. While the chirp in the width of the dielectric layer provides a shift in center wavelength absorption, the chirp in cavity separation provides a change in phase shift due to the spacing of the resonant light absorption.

Figure 5A:
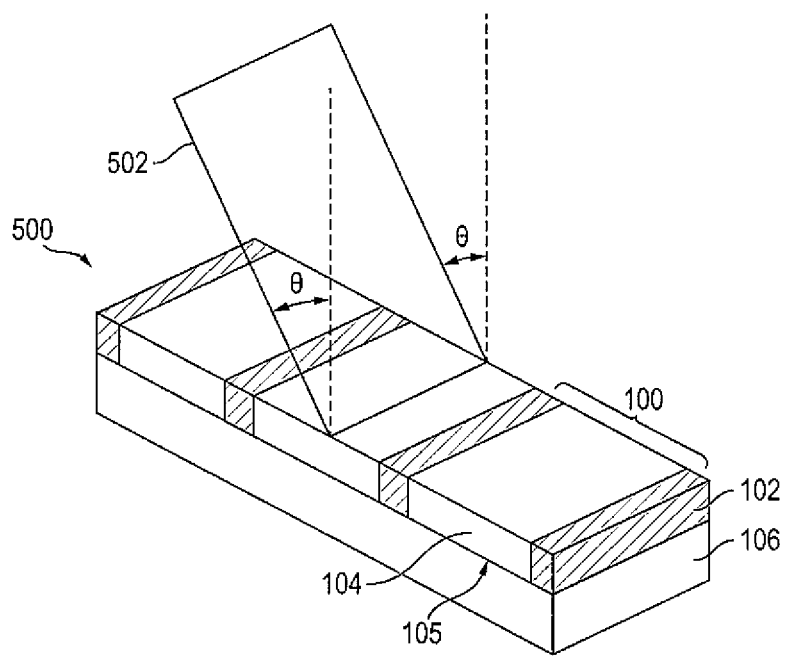
FIG. 5A is a perspective view of the detector and its sensitivity plane, according to some example embodiments of the present invention.
Figure 5B:
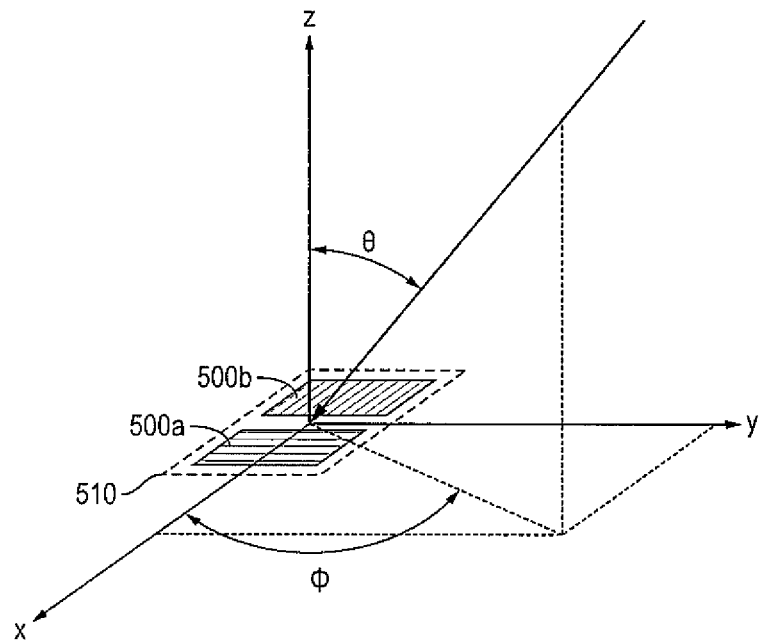
FIG. 5B is a perspective view of a two-cell detection unit including two orthogonal detectors and, according to some example embodiments of the present invention.
Figure 5C:
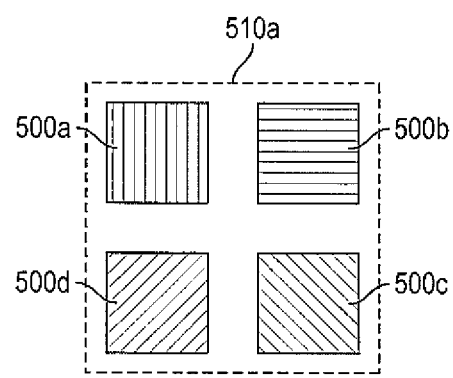
FIG. 5C illustrates a top view of a multi-cell detection unit including detectors having various orientations, according to some example embodiments of the present invention.

FIG. 5A is a perspective view of the detector 500 and its sensitivity plane 502, according to some example embodiments of the present invention. FIG. 5B is a perspective view of a two-cell detection unit 510 including two orthogonal detectors 500a and 500b, according to some example embodiments of the present invention. FIG. 5C illustrates a top view of a multi-cell detection unit 510a including detectors having various orientations, according to some example embodiments of the present invention.

Referring to FIG. 5A, a detector 500 includes an array of TFP resonators 100 and has a directional sensitivity (e.g., selectivity) represented by the two-dimensional sensitivity planes (e.g., selection planes) 502. Of light rays incident on the surface of the detector 500, those that are parallel to the sensitivity plane 502 may generate the maximum response at the detector 500. The sensitivity angle θ of the sensitivity plane 502, which is measured with respect to a direction normal to the surface of the detector 500, may be adjusted as desired by introducing a chirp in the width of the conductive and/or dielectric layers 102/104 and/or combining the responses the TFP resonators 100 of the detector 500 in a particular way.

Incident light that does not fall within the sensitivity plane 502 (e.g., light having an incidence plane with an incidence angle different from the sensitivity angle θ) may illicit a response from the detector 500 that is less than maximal but follows a sensitivity profile of the detector 500. (Curves 316 of FIG. 3B and curve 324 of FIG. 3C illustrate examples of the sensitivity profile for the respective embodiments). The incidence plane may be defined as an imaginary plane parallel to the incident light, which is also parallel with the lengthwise direction of the cavity 105 (e.g., Y-direction in FIG. 1A), and the incidence angle may be defined as the smallest angle between the incidence plane and a normal plane (e.g., an imaginary plane orthogonal to the top surface of the detector 500 that is also parallel to the lengthwise direction of the cavity 105). Accordingly, the detector 500 may be used to measure the angle (e.g., polar angle) of the incident light. Additionally, detector 500 may be utilized to make a binary determination as to whether or not incident light falls within a narrow range of incidence angles.

In some example embodiments, two or more detectors 500 set at angles to one another are combined to form a multi-cell detection unit having directional sensitivity (e.g., directional selectivity) that is narrowed to not only to a range of polar angles θ, but also a range of azimuth angles φ. For example, as illustrated in FIG. 5B, a two-cell detection unit 510 that combines two detectors 500a and 500b, which are angled from one another (e.g., have cavity length directions that are orthogonal to one another) may have a directional sensitivity that is narrowed to a range of polar angles θ and azimuth angles φ. Thus, two detectors set at different angles may be used to determine the polar and azimuth angles θ and φ of incident light. Increasing the number of detectors (or detector cells) in a multi-cell detection unit may result in further narrowness of the selective range of polar and azimuth angles θ and φ of incident light.

According to some embodiments, the detectors in the multi-cell detection unit (e.g., the detectors 500a and 500b) are at a same plane (e.g., the X-Y plane shown in FIG. 5B), and are operationally substantially similar to the detector 500 described with respect to FIG. 5A. The detectors may have selection planes at angles that are substantially the same or different, depending on the desired selection polar and azimuth angles θ and φ.

In some example embodiments, the two-cell detection unit 510 includes two axisymmetric detectors 500a and 500b (e.g., two orthogonal detectors having no chirp), which have no angle bias (e.g., have sensitivity planes 502 that are orthogonal to the surface of the detectors 500a and 500b). In such embodiments, an incident normal light may excite both sensors, whereas an off-normal light source may excite only one or neither of the detectors. Thus, the two-cell detection unit 510 may be configured to detect light that is substantially normal to the surfaces of both detectors 500a and 500b. However, it may be possible for such a two-cell detection unit 510 to give a false positive when there are multiple sources of light. This may be overcome by increasing the number of detector orientations.

For example, the multi-cell detection unit 510a shown in FIG. 5D, which includes two sets of orthogonal detectors that are set at an angle to one another (e.g., detectors 500a, 500b, 500c, and 500d set at 45° angles to one another), may be less prone to false positive detection of normal incident light when in the presence of multiple light sources. Increasing the number of detector cells with different orientations may further enhance (e.g., increase) the detection robustness of the multi-cell detection unit 510a.

Figure 6A:
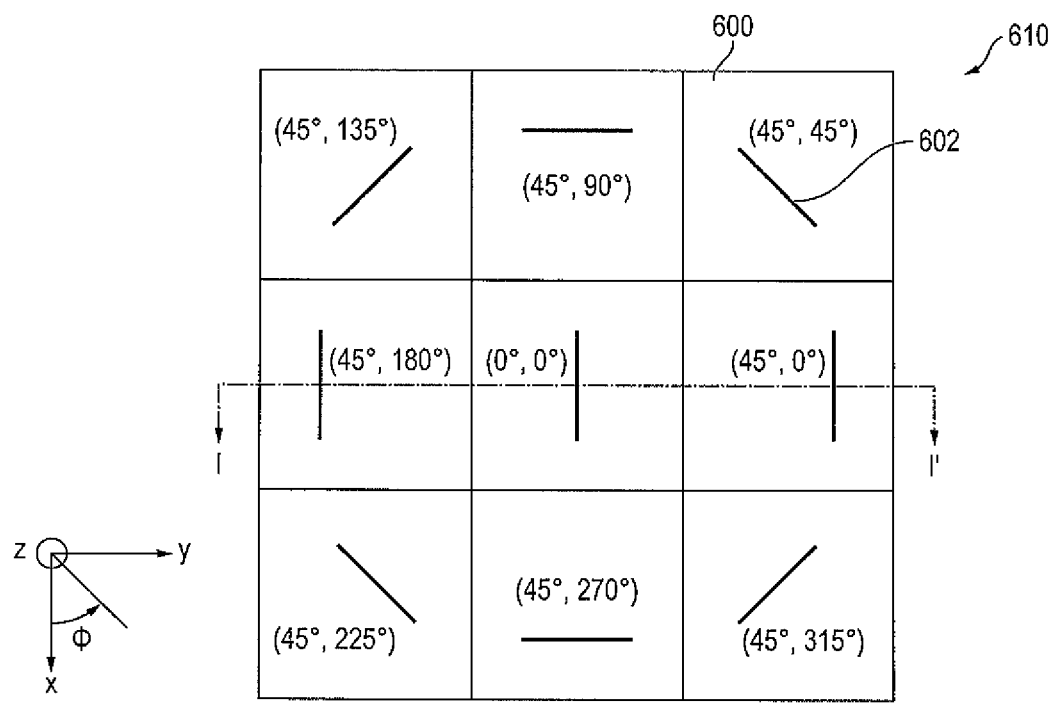
FIG. 6A illustrates a top view of a multi-cell detection unit including detectors sensitive to different directions, according to some example embodiments of the present invention.
Figure 6B:
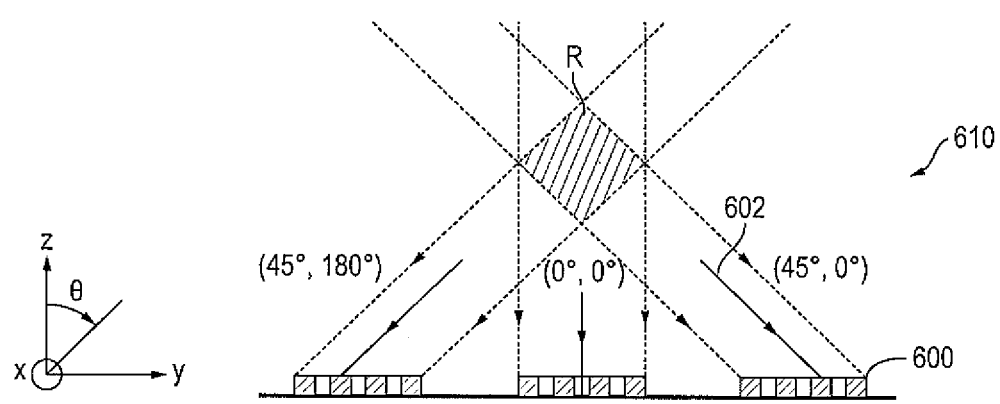
FIG. 6B is a cross-sectional representation of the multi-cell detection unit of FIG. 6A illustrating the directional sensitivity of the detector cells that are along the horizontal cross-section of FIG. 6A, line I-I'.

FIG. 6A illustrates a top view of a multi-cell detection unit 610 including detectors 600 sensitive to different directions, according to some example embodiments of the present invention. FIG. 6B is a cross-sectional representation of the multi-cell detection unit 610 of FIG. 6A illustrating the directional sensitivity of the detector cells that are along the line I-I' (of FIG. 6A). Each of the detectors 600 is substantially similar to the detector 500 of FIG. 5A, and a description of the structure and operation thereof may not be repeated here.

Referring to FIG. 6A, a multi-cell detection unit 610 includes a plurality of detectors (e.g., detector cells) 600 sensitive to 9 different directions as indicated by the polar and azimuthal (θ, μ) angles. FIG. 6A shows the orientations of each of the sensitivity planes (e.g., selection planes) 602 as they cross the respective one of the detectors 600 (which exist in the X-Y plane, as shown in FIG. 6A). FIG. 6B shows the orientation of the sensitivity planes (e.g., selection planes) 602 of the detectors 600 along the line I-I' as said sensitivity planes 602 cross a plane normal to the surface of the detectors (e.g., the Y-Z plane shown in FIG. 6B). By comparing the outputs of the different detectors 600 of the multi-cell detection unit 610, it is possible to estimate the angular direction of an incident light that may not be normal to the surface of the multi-cell detection unit 610.

Further, as the sensitivity planes 602 of the detectors 600 converge at a region R above the multi-cell detection unit 610, a light source in region R may excite (e.g., maximally excite) all of the detectors 600 of the multi-cell detection unit 610, whereas a light source outside of region R may only excite (e.g., maximally excite) some or none of the detectors 600 depending on its position relative to the multi-cell detection unit 610. Thus, in addition to estimating an angle of incident light, the multi-cell detection unit 610 may be used to detect the presence of a light source (e.g., an object reflecting light) within a region (e.g., region R) above its surface.

Figure 7:
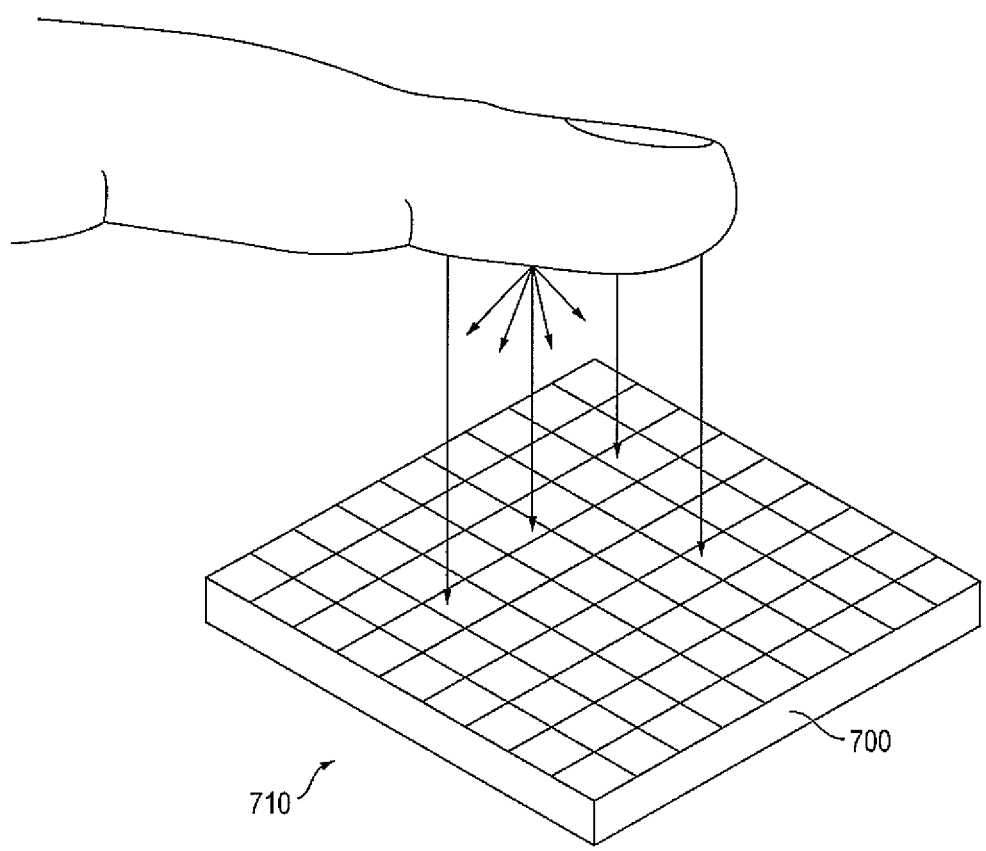
FIG. 7 illustrates a detection matrix including a large number of detectors, according to some example embodiments of the present invention.

FIG. 7 illustrates a detection matrix 710 including a large number of detectors 700, according to some example embodiments of the present invention. Each of the detectors 700 is substantially similar to the detector 500 of FIG. 5A, and a description of the structure and operation thereof is not repeated here.

Referring to FIG. 7, a larger number (e.g., more than 9) of detectors 700 may be combined to form a detection matrix 710. Each detector 700 in the matrix may be part of one or more multi-cell detection units (similar to the multi-cell detection unit 610 of FIG. 6A) capable of detecting angular direction of incident light and/or the presence of a light source at a particular region in space above the multi-cell detection unit. Thus, the detection matrix includes a plurality of multi-cell detection units, which may be overlapping (e.g., share common detectors 700). By combining the outputs of the detectors 700 (e.g., the outputs of the plurality of multi-cell detection units) an image of an object may be captured and/or a spatial position of the object (or a light source) may be determined. Therefore, embodiments of the present invention may achieve lens-less imaging and/or hover estimation. The concepts outlined above, thus, presents an alternative approach to light field imaging.

According to some embodiments of the present invention, in which the detection matrix 710 acts as an imager, the detectors 700 may have no angular bias (e.g., have a polar angle θ substantially equal to zero), thus, detecting light that is substantially normal to the surface of the detection matrix 710. Light from a point on an object (such as a user finger, as shown in FIG. 7) may irradiate (e.g., reflect) in all direction and reach the imager matrix from all directions, however, said imager may only detect normally incident light. By capturing normally incident light from various points on the object, the imager may capture an image of the object. This imaging technique, as described, has no magnification and uses no focusing optics, as the imaging power is not sensitive to the object's distance from the imager. The resolution of such an imager may depend, in part, on the angular sensitivity (e.g., sharpness) of the detectors employed in the detection matrix. For example, to resolve a finger print, when the angular detection sharpness is 1°, the finger may be up to 3 mm from the imager without the need for any focusing optics.

Figure 8A:
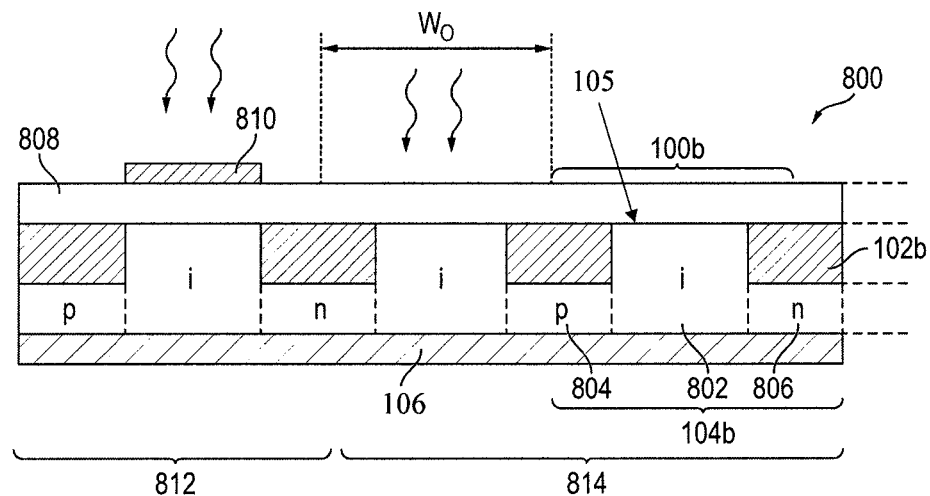
FIG. 8A is a cross-sectional view of a TFP light sensor including a transistor and a detector, according to some embodiments of the present invention.
Figure 8B:
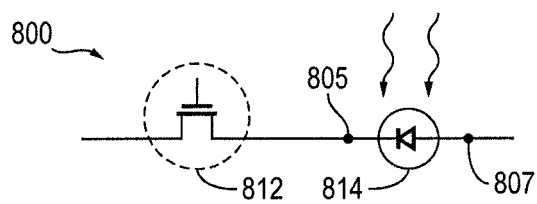
FIG. 8B illustrates the equivalent circuit diagram of the TFP light sensor of FIG. 8A.
Figure 8C:
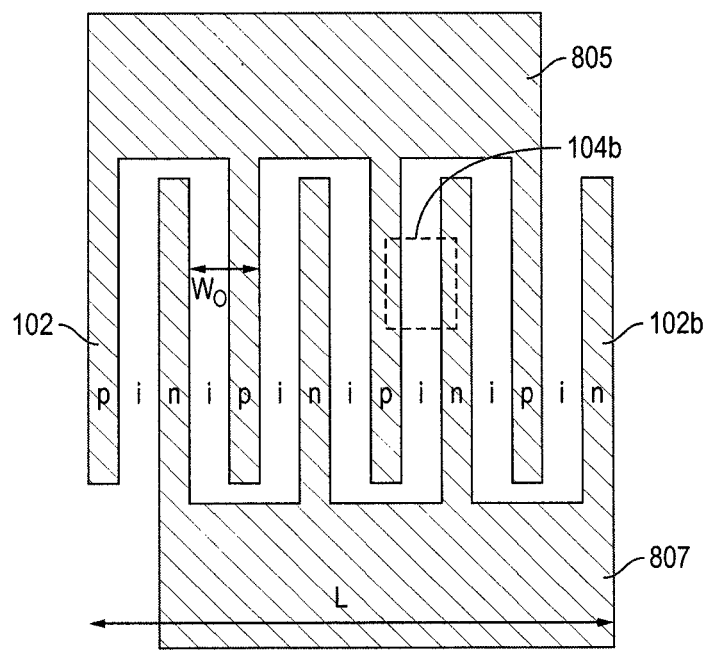
FIG. 8C is a top view of the electrode layout of the detector, according to some example embodiments of the present invention.

FIG. 8A is a cross-sectional view of a light sensor 800 including a gate transistor 812 and a detector 814 that is a TFP resonator, according to some embodiments of the present invention. The TFP resonator electrically may be approximated as two back to back Schottky diodes and therefore the TFP resonator detector may be approximately treated as a photodiode detector, as illustrated in FIG. 8A. FIG. 8B illustrates the equivalent circuit diagram of the TFP light sensor 800 of FIG. 8A. FIG. 8C is a top view of the electrode layout of the detector 814, according to some example embodiments of the present invention.

In some embodiments of the present invention, the TFP light sensor 800 includes an array of TFP resonators 100b, in which each resonator 100b is similar in operation and structure to the TFP resonator 100 of FIG. 1, except for the dielectric structure 104b. According to some embodiments, the dielectric structure 104b includes an intrinsic semiconductor region (e.g., an undoped semiconductor or i-type semiconductor region) 802 between a p-type semiconductor region 804 and an n-type semiconductor region 806. Therefore, dielectric structure 104b may resemble the fin-like dielectric structure 104b of FIG. 1B. The p-type (p-channel) and n-type (n-channel) semiconductor regions 804 and 806 may be heavily doped to act as ohmic contacts and may be located under the conductive structures 102. The regions 802, 804, and 804 of the dielectric structure 104b may include any suitable semiconductor material, such as silicon (Si) and/or the like. A cavity is formed by the intrinsic semiconductor region 802 sandwiched between the two conductive structures (e.g., electrodes) 102. The top surface of the TFP resonators 100b is covered by an insulating layer 808 that is substantially transparent to light of the desired detection wavelength (e.g., infrared light), which permits light to pass through to the cavities of the TFP resonators 100b. For example, the insulating layer 808 may include glass (e.g., SiO$_2$), hafnium silicate, hafnium dioxide, zirconium dioxide and the like. In some embodiments, a conductive light blocking structure 810 is located on the insulating layer 808 to overlap (e.g., cover the entirety of) an intrinsic semiconductor region 802 of one of the TFP resonators 100b. The conductive light blocking structure 810 includes any suitable material (such as gold, silver, aluminum, or the like) that is electrically conductive and is also opaque to light of the desired detection wavelength. Thus, the conductive light blocking structure 810 may block (e.g., prevent) light of the desired detection wavelength to penetrate or reach the underlying cavity. In addition to blocking light from reaching the cavity of the underlying TFP resonator 100b, the conductive light blocking structure 810 may also function as a gate electrode, which, together with the structure of the underlying TFP resonator 100b, forms a transistor (e.g., a schottky barrier field effect transistor) 812. Thus, as shown in FIGS. 8A and 8B, the TFP light sensor 800 includes a TFP resonators 100b that is covered by the conductive light blocking structure 810, which acts as a transistor (e.g., switch), and a plurality of TFP resonators 100b that are exposed to external light (and not covered by any light blocking layers), which act as a detector (e.g., photodiode) 814. The detector 814 is similar in structure and operation to the detector 500 of FIG. 5A, and a detailed description thereof is not repeated here.

While FIG. 8A illustrates a TFP light sensor 800 having only one conductive light blocking structure 810, embodiments of the present invention are not limited thereto. Indeed, according to other embodiments of the present invention, the TFP light sensor may have any suitable number of conductive light blocking layers and corresponding light-blocked TFP resonators 100b.

According to some embodiments, the conductive structures 102 of the detector 814 corresponding to (e.g., overlapping with or covering) the p-type semiconductor regions 804 are coupled to (e.g., electrically connected to) one another via an electrode 805 and, similarly, the conductive structures 102 of the detector 814 corresponding to the n-type semiconductor regions 806 are coupled to one another via an electrode 807. As shown in FIG. 8C, the size and number of the TFP resonators 100*b* may be chosen such that the TFP light sensor 800 fills a rectangular pixel (e.g., square pixel). In some embodiments, the width $W_0$ of each of the TFP resonators 100*b* may be about 60 nm, and the length L of the pixel formed by the TFP light sensor 800 may be about 120 μm.

Figure 9:
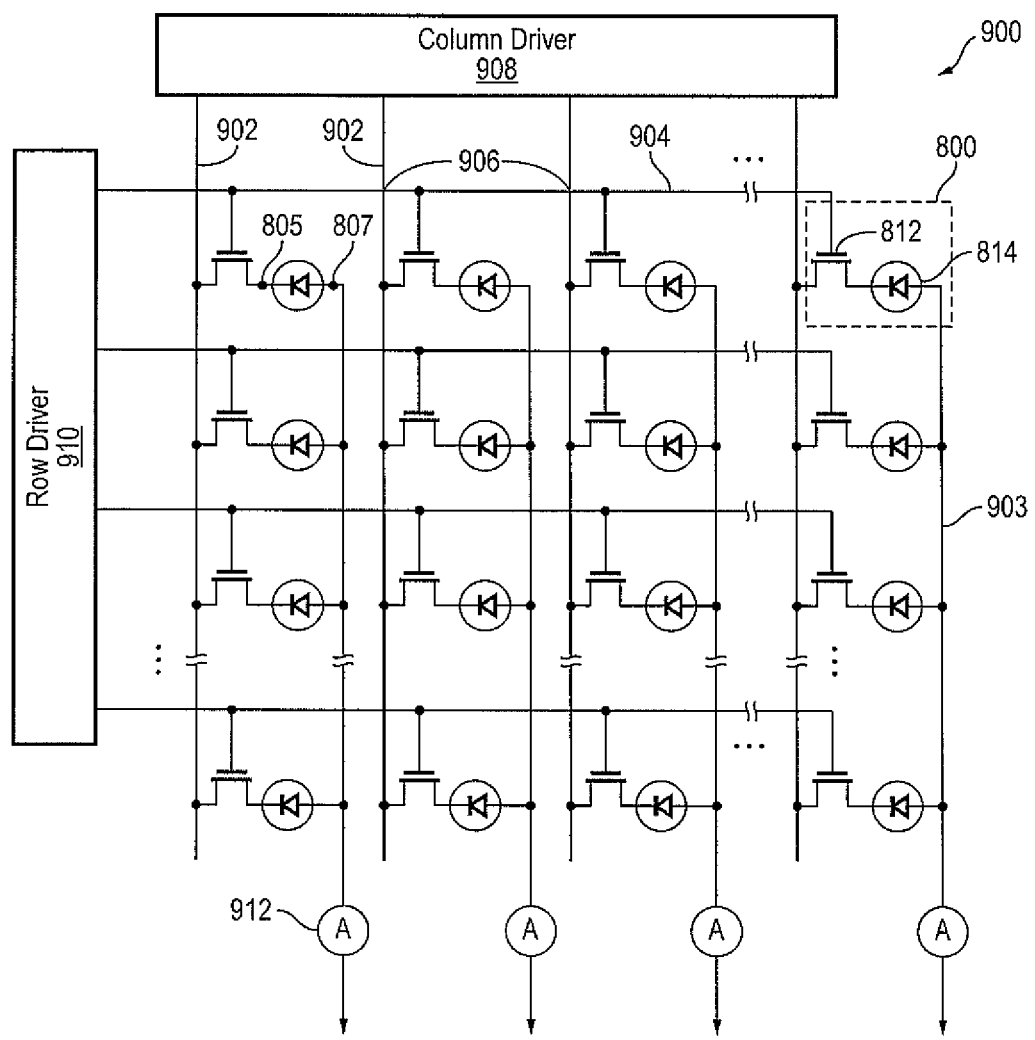
FIG. 9 is a schematic representation of an optical sensing array, according to some embodiments of the present invention.

FIG. 9 is a schematic representation of an optical sensing array 900 including detectors 800 that are TFP resonators 100, according to some embodiments of the present invention.

In some embodiments, an optical sensing array 900 further includes first column electrodes 902 and row electrodes 904. The first column electrodes 902 are coupled to the source electrodes of field effect transistor 812 of each column of TFP detectors 800 and the row electrodes 904 are coupled to the gate (select) of the field effect transistors 812. The drains of the field effect transistors 812 are coupled to each photodiodes 814 that are TFP resonators, which are coupled to a set of second column electrodes 903. There may be an insulation layer between the first column conductors 902 and the row conductors 904 at each of the crossings 906.

One end of each of the first column electrodes 902 is coupled to (e.g., electrically connected to) a column driver 908, and one end of each of the row electrodes 904 is coupled to (e.g., electrically connected to) a row driver 910. At the other end of each of the second column electrodes 903, the optical sensing array 900 includes current sensors 912.

In some embodiments, the row driver 910 powers a row of TFP light sensors 800 by applying a suitable voltage to the corresponding row electrode 904 to select through gate electrodes of the Schottky FET of the sensors 800, and the column driver 908 applies source voltage to columns of TFP light sensors 800 through the corresponding first column electrode 902. Thus, through the combined operation of the column and row drivers 908 and 910, an individual TFP light sensor 800 may be addressed.

The current of the addressed TFP light sensor 800, which represents the response of the TFP light sensor 800 to incident light, may then be measured by a current sensor 912. The current sensor 912 may employ any suitable circuit and method known in the art for measuring the photo current of the TFP light sensors 800. For example, the current may flow through a resistor of known value, and the voltage across the resistor is measured. The current sensors 912 may be coupled to a processing unit (e.g., a display device) for processing the responses of each of the TFP light sensors 800 in the optical sensing array 900 to, for example, capture an image of an object and/or to detect/track the object's position/movements.

Figure 10A:
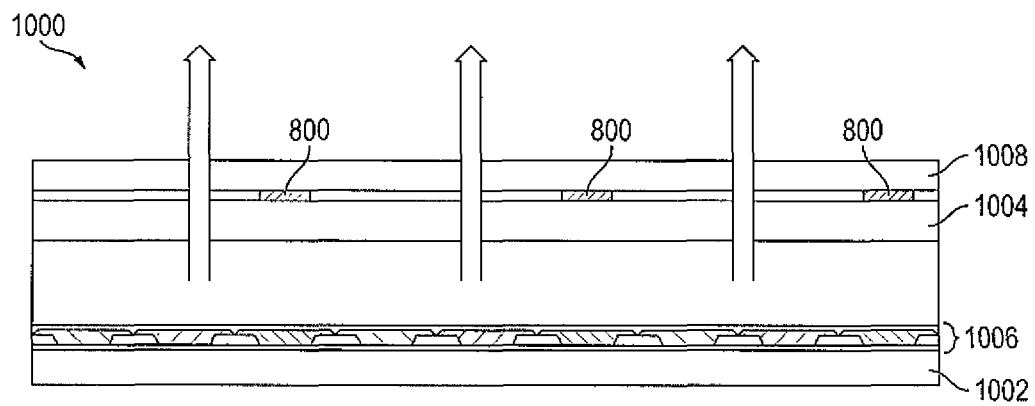
FIGS. 10A and 10B illustrate cross-sectional views of the display panels with integrated optical sensing arrays, according to some example embodiments of the present invention.
Figure 10B:
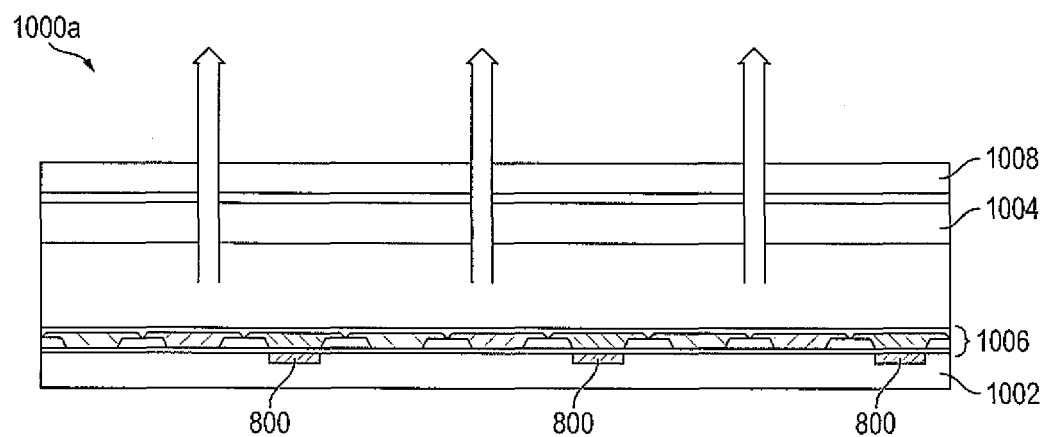

FIGS. 10A and 10B illustrate cross-sectional views of the display panels with integrated optical sensing arrays, according to some example embodiments of the present invention.

In some embodiments of the present invention, the optical sensing array 900 is integrated with an imaging device or a display device (e.g., a display panel 1000), or the like. Referring to FIGS. 10A and 10B, the optical sensing array 900 may be integrated into (e.g., embedded into) a display panel (e.g., an OLED panel) 1000 including a bottom substrate 1002, a top substrate 1004, and a light emitting layer 1006 therebetween. The light emitting layer 1006 may include pixels having red, green, and blue light emitters, which may be top or bottom emissive. The detectors 814 may be located above the light emitting layer 1006 (e.g., in a direction of light emission) or below the light emitting layer 1006 (e.g., away from the direction of light emission).

In some examples, the detectors 814 may be on the inner or outer surface of the top substrate 1004 or the bottom substrate 1002.

In some embodiments, there may be one detector 814 (or TFP light sensor 800) per display pixel or higher number of display pixels. Further, the detectors 814 may be directly above the TFT, the black matrix, or another region of a display pixel. Additionally, in some embodiments, the detectors 814 are sensitive to (e.g., exhibit resonance at) wavelengths of light that are outside of the visible range (e.g., within the infrared range), and thus, transmit through the red, green, and blue lights of the light emitting layer 1006. As a result, the optical sensing array 900 may have little impact on the light transmission of the display panel 1000.

The display panel 1000 described above and shown in FIGS. 10A and 10B is for illustration purposes only, and according to embodiments of the present invention, the detectors, TFP light sensors, and/or the optical sensing array may be integrated into a display panel having any suitable structure as known to person of ordinary skill in the art.

Figure 11A:
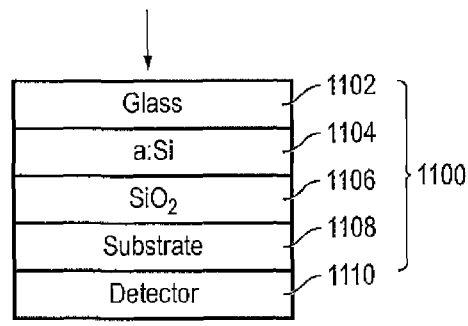
FIG. 11A is a cross-sectional view of a filter located on top of a detector, according to some example embodiments of the present invention.
Figure 11B:
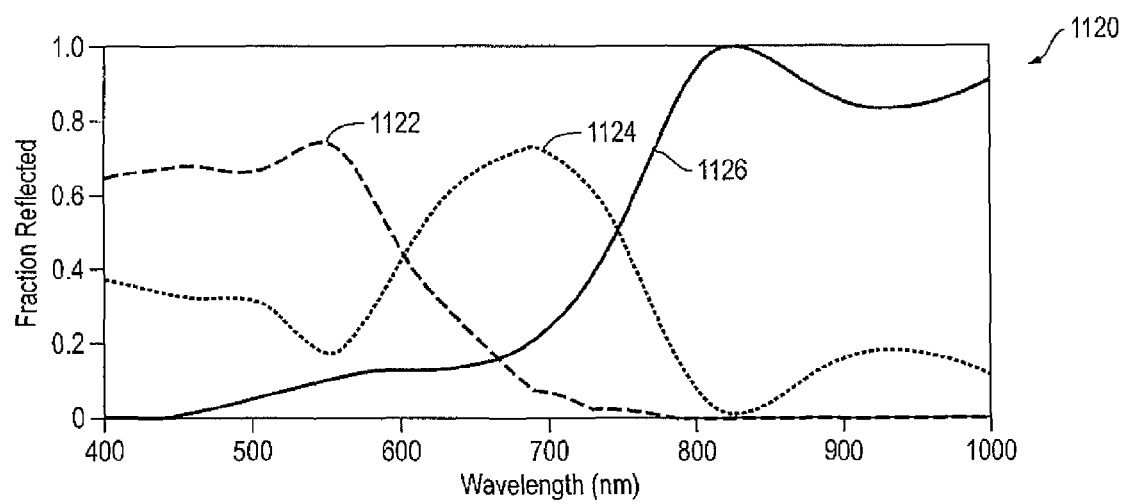
FIG. 11B illustrates the spectral absorption, reflection, and transmission of the filter 1100, according to some example embodiment of the present invention.

FIG. 11A is a cross-sectional view of a filter 1100 located on top of a TFP detector 1110, according to some example embodiments of the present invention. FIG. 11B illustrates the spectral absorption, reflection, and transmission of the filter 1100, according to some example embodiment of the present invention. Detector 1110 may be substantially similar to the detector 500 of FIG. 5A or detector 814 of FIG. 8 in terms of structure and operation, and a detailed description thereof is not repeated here.

In some embodiments, the detector 1110 may be covered by a filter 1100, which transmits a wavelength range that causes excitation within the detector 1110, while substantially filtering wavelengths of light outside of that range. In some example embodiments, the filter 1100 includes a transparent layer (e.g., a glass layer) 1102, an amorphous silicon (a:Si) layer 1104, an insulating layer (including, e.g., silicon dioxide) 1106, and substrate (including, e.g., silicon) stacked on one another. As amorphous silicon absorbs strongly in the visible spectrum (e.g., about 400 nm to about 600 nm) and transmits in the near infrared spectrum (e.g., about 750 nm to about 1000 nm), the filter 1100 may act as a day-light blocking filter.

Referring to FIG. 11B, curves 1122, 1124, and 1126 represent the light absorption, reflection, and transmission (as a function of wavelength) of a filter 1100 including an amorphous silicon layer 1104 having a thickness of about 110 nm, and a silicon dioxide insulating layer 1106 having a thickness of about 330 nm. Sharper absorption/transmission cut-offs may be achieved by increasing the thickness of the amorphous silicon layer 1104 and silicon dioxide insulating layer 1106 and/or using multiple layers of amorphous silicon and silicon dioxide in the filter 1100.

Figure 12A:
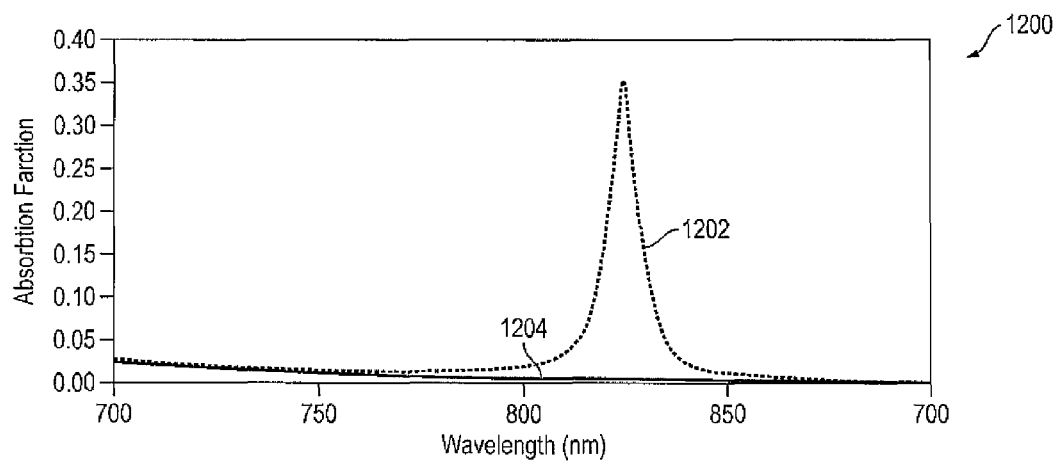
FIG. 12A is a graph illustrating the enhancement of light absorption of the TFP resonator at resonance, as compared to a silicon photodetector without a resonant cavity, according to some example embodiments of the present invention.

FIG. 12A is a graph 1200 illustrating the enhancement of light absorption of the TFP resonator at resonance, as compared to a sensor using the same materials but without the resonant cavity, according to some example embodiments of the present invention.

In FIG. 12A, curves 1202 and 1204 represent the absorption fraction of a TFP resonator 100 and a sensor made using the same light sensitive dielectric or semiconducting layer without the fin structure, respectively, as a function of wavelength. In some embodiments of the present invention, the TFP resonator 100 enhances absorption at resonance by a factor of about 70. This enhancement may be tuned by adjusting the cavity dimensions of the TFP resonator 100. In some example embodiments, the resonance has a quality factor (Q-factor) of about 75 with a full width at half maximum (FWHM) of about 11 nm. The narrow bandwidth of the TFP resonator 100 allows for substantial exclusion of undesirable wavelengths.

Figure 12B:
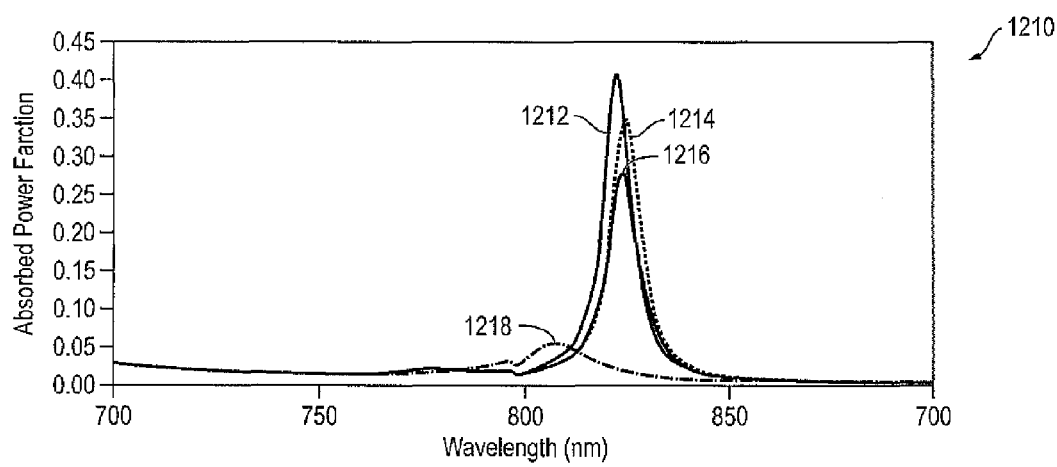
FIG. 12B is a graph illustrating the effect of various materials of the conductive structure on the Q-factor of a TFP resonator, according to some example embodiments of the present invention.

FIG. 12B is a graph 1210 illustrating the effect of various materials of the conductive structure 102 on the Q-factor of a TFP resonator 100, according to some example embodiments of the present invention.

In FIG. 12B, curves 1212, 1214, 126, and 1218 represent the absorbed power fractions (absorption factors) of TFP resonators, each having a conductive structure 102 made of gold, silver, copper, and aluminum, respectively (i.e., one made of gold, one made of silver, etc.), as a function of wavelength. As is shown in FIG. 12B, the choice of material for the conductive structure 102 changes the index contrast or the Q-factor of the cavity of the TFP resonator 100. For example, the absorption enhancement for aluminum may be about 0.34 times that of gold.

Figure 13:
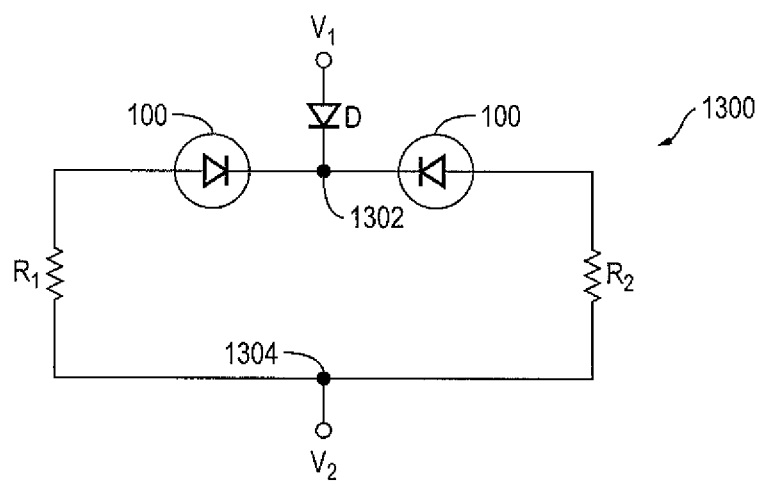
FIG. 13 is a schematic representation of a nulling configuration used to subtract the responses of an adjacent pair of TFP resonators in a detector, according to some example embodiments of the present invention.

FIG. 13 is a schematic representation of a nulling configuration 1300 used to subtract the responses of an adjacent pair of TFP resonators 100 in a detector, according to some example embodiments of the present invention.

In some embodiments, pairs of TFP resonators 100 are coupled together in a nulling configuration 1300 to estimate a non-normal angle of light incident. The nulling configuration 1300 may include two adjacent TFP resonators 100 that are coupled together (e.g., directly coupled together) on one end at node 1302 and coupled together through two resistors R1 and R2 at their other ends. A blocking diode D may be coupled to node 1302. The voltage measured across the free end of the blocking diode and node 1304 (e.g., V1−V2) is proportional to the difference in output current of the adjacent TFP resonators 100. The relative weight of the current of each of the TFP resonators 100 in the subtraction process may be modified by adjusting the resistance values of resistors R1 and R2.

While the nulling configuration 1300 shows a particular method of combining the outputs of TFP resonators 100 of a detector, embodiments of the present invention are not limited thereto and any other suitable nulling configuration or method of combining outputs known to a person of ordinary skill may be used.

An imaging device that employs one or more detectors may utilize a local or external light source that emits light in the resonant wavelength range of the one or more detectors. In the example of a touchscreen device, the light source may be integrated with a touch screen or be positioned at the periphery of the touch screen, and illuminate the space above the touch screen.

While the present invention has been described in connection with certain example embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An optical light sensor to detect light of a wavelength range and an incidence angle range, the optical light sensor comprising:
   a transistor integrated with a detector, comprising:
      a substrate;
      a plurality of dielectric structures on the substrate;
      an electrode of the transistor on a dielectric structure of the plurality of dielectric structures, to block light of the wavelength range from reaching the dielectric structure, other ones of the plurality of dielectric structures being configured to receive light through a side of the dielectric structure opposite to the substrate;
      a plurality of conductive structures on the substrate, consecutive conductive structures of the plurality of conductive structures having a corresponding dielectric structure of the plurality of dielectric structures therebetween, first ones of the plurality of conductive structures being coupled together, second ones of the plurality of conductive structures being coupled together, and the first and second ones of the plurality of conductive structures being alternately arranged; and
      a transparent insulation layer on the plurality of dielectric structures and the plurality of conductive structures,
      wherein the consecutive conductive structures and the corresponding dielectric structure form a cavity to induce an absorption resonance in response to receiving the light of the wavelength range.

2. The optical light sensor of claim 1, wherein widths of successive ones of the plurality of dielectric structures progressively increase.

3. The optical light sensor of claim 1, wherein widths of successive ones of the plurality of conductive structures progressively increase.

4. The optical light sensor of claim 1, wherein the plurality of dielectric structures includes semiconductor materials.

5. The optical light sensor of claim 4, wherein the semiconductor materials include at least one of silicon, amorphous silicon.

6. The optical light sensor of claim 1, wherein the plurality of conductive structures includes at least one of gold, silver, aluminum, copper.

7. The optical light sensor of claim 1,
   wherein the consecutive conductive structures are to receive a differential voltage,
   wherein the differential voltage induces the cavity to generate a current in response to light absorbed by the conductive and dielectric structures.

8. The optical light sensor of claim 1, wherein the plurality of dielectric and conductive structures form a plurality of cavities comprising the cavity, each one of the plurality of cavities being configured to generate a signal in response to the received light having the wavelength range, the generated signal being indicative of the angle of incidence of the received light having the wavelength range.

9. The optical light sensor of claim 8, further comprising a detection circuit to combine generated signals of neighboring cavities from the plurality of cavities in a predetermined phase relation, and to generate an output signal when an angle of incidence of the received light having the wavelength range is within the incidence angle range,
   wherein the angle of incidence is an angle between an incidence plane and a normal plane orthogonal to the detector, both the incidence plane and the normal plane being in parallel with a lengthwise direction of a cavity of the plurality of cavities.

10. The optical light sensor of claim 1, wherein the cavity is transparent to visible light.

11. A multi-cell detection unit to detect a normally incident light of a wavelength range, the multi-cell detection unit comprising:
   a plurality of optical light sensors, each optical light sensor being configured to generate a signal in response to detecting light of the wavelength range having an

19 incidence plane normal to the optical light sensor and parallel to a lengthwise direction of a cavity of the optical light sensor, each optical light sensor comprising:
a transistor integrated with a detector, comprising:
a substrate;
a plurality of dielectric structures on the substrate;
an electrode of the transistor on a dielectric structure of the plurality of dielectric structures, to block light of the wavelength range from reaching the dielectric structure, other ones of the plurality of dielectric structures being configured to receive light through a side of the dielectric structure opposite to the substrate;
a plurality of conductive structures on the substrate, consecutive conductive structures of the plurality of conductive structures having a corresponding dielectric structure of the plurality of dielectric structures therebetween, first ones of the plurality of conductive structures being coupled together, second ones of the plurality of conductive structures being coupled together, and the first and second ones of the plurality of conductive structures being alternately arranged; and
a transparent insulation layer on the plurality of dielectric structures and the plurality of conductive structures,
wherein the consecutive conductive structures and the corresponding dielectric structure form the cavity to induce an absorption resonance in response to receiving the light of the wavelength range,
wherein lengthwise directions of cavities of a first and second optical light sensors of the plurality of optical light sensors are at an angle to one another.

12. The multi-cell detection unit of claim 11, wherein a concurrent detection by the first and second optical light sensors indicates detection of the normally incident light of the wavelength range.

13. The multi-cell detection unit of claim 11, wherein the first and second optical light sensors are at a same plane, and the lengthwise directions of the cavities of the first and second optical light sensors are orthogonal to one another.

14. An optical light sensor to detect a light of a wavelength range, the optical light sensor comprising:
a transistor integrated with a detector, comprising:
a plurality of p-type semiconductors and a plurality of n-type semiconductors alternately arranged in a transverse direction;
a plurality of intrinsic semiconductors, each intrinsic semiconductor between a corresponding one of the p-type semiconductors and a corresponding one of the n-type semiconductors;
a plurality of electrodes on the plurality of p-type and n-type semiconductors, and forming a plurality of cavities with corresponding ones of the plurality of intrinsic semiconductors therebetwee;
a transparent insulation layer on the plurality of intrinsic semiconductors and the plurality of electrodes; and
a gate electrode of the transistor on a first cavity of the plurality of cavities, to block light of the wavelength range from reaching the cavity,
wherein first ones of the plurality of electrodes on the plurality of p-type semiconductors are coupled together, and second ones of the plurality of electrodes on the plurality of n-type semiconductors are

20 coupled together, the first and second plurality of electrodes being alternately arranged,
wherein a second cavity of the plurality of cavities is exposed to incident light in a longitudinal direction and is configured to induce an absorption resonance in response to received light of the wavelength range.

15. The optical light sensor of claim 14, wherein widths of successive ones of the plurality of intrinsic semiconductors and/or widths of successive ones of the plurality of electrodes progressively increase.

16. An optical sensing array to detect a light of a wavelength range, the optical sensing array comprising:
a plurality of row conductors;
a plurality of column conductors crossing the row conductors;
a plurality of optical light sensors coupled to the plurality of row and column conductors, each one of the plurality of optical light sensors comprising:
a transistor integrated with a detector, comprising:
a plurality of p-type semiconductors and a plurality of n-type semiconductors alternately arranged in a transverse direction;
a plurality of intrinsic semiconductors, each intrinsic semiconductor between a corresponding one of the p-type semiconductors and a corresponding one of the n-type semiconductors;
a plurality of electrodes on the plurality of p-type and n-type semiconductors, and forming a plurality of cavities with corresponding ones of the plurality of intrinsic semiconductors therebetween; and
a gate electrode of the transistor on a first cavity of the plurality of cavities, to block light of the wavelength range from reaching the cavity, the gate electrode being coupled to one of the plurality of column conductors;
wherein first ones of the plurality of electrodes on the plurality of p-type semiconductors are coupled together, and second ones of the plurality of electrodes on the plurality of n-type semiconductors are coupled together, the first and second plurality of electrodes being alternately arranged,
wherein a second cavity of the plurality of cavities is configured to be exposed to incident light in a longitudinal direction and is configured to induce an absorption resonance in response to received light of the wavelength range.

17. The optical sensing array of claim 16, wherein each one of the plurality of optical light sensors is to generate a current in response to, and in proportion to, received light of the wavelength range when the row conductor is addressed via a row driver.

18. A display device comprising the optical sensing array of claim 16.

19. An optical light sensor to detect a light of a wavelength range, the optical light sensor comprising:
a transistor integrated with a detector, comprising:
a plurality of p-type semiconductors and a plurality of n-type semiconductors alternately arranged in a transverse direction;
a plurality of intrinsic semiconductors, each intrinsic semiconductor between a corresponding one of the p-type semiconductors and a corresponding one of the n-type semiconductors;
a plurality of electrodes on the plurality of p-type and n-type semiconductors, and forming a plurality of cavities with corresponding ones of the plurality of intrinsic semiconductors therebetween;
a transparent insulation layer on the plurality of intrinsic semiconductors and the plurality of electrodes; and
a gate electrode of the transistor on a first cavity of the plurality of cavities, to block light of the wavelength range from reaching the cavity,
wherein first ones of the plurality of electrodes on the plurality of p-type semiconductors are coupled together, and second ones of the plurality of electrodes on the plurality of n-type semiconductors are coupled together, the first and second plurality of electrodes being alternately arranged,
wherein a second cavity of the plurality of cavities is configured to induce an absorption resonance in response to received light of the wavelength range.

* * * * *